United States Patent
Potter

[11] Patent Number: 5,488,778
[45] Date of Patent: Feb. 6, 1996

[54] ELECTRONIC MAGNETOMETER AND COMPASS

[76] Inventor: Bronson Potter, Box 332, Greenville, N.H. 03048

[21] Appl. No.: 456,851

[22] Filed: Jun. 1, 1995

Related U.S. Application Data

[63] Continuation of Ser. No. 182,646, Jan. 14, 1994, abandoned.

[51] Int. Cl.$^6$ .................................................. G01C 17/02
[52] U.S. Cl. .......................... 33/355 R; 324/244; 33/362
[58] Field of Search .................................. 33/355 R, 356, 33/357, 358, 359, 360, 361, 362, 363; 324/244, 246, 256, 259, 260, 261

[56] References Cited

U.S. PATENT DOCUMENTS

| | | | |
|---|---|---|---|
| 2,334,593 | 11/1943 | Wyckoff | 324/244 |
| 2,434,324 | 1/1948 | Lehde | 33/362 |
| 2,474,693 | 6/1949 | Rowe | 324/244 |
| 2,533,299 | 12/1950 | Walsh | 177/352.6 |
| 2,566,098 | 8/1951 | Van Dijck | 33/355 R |
| 3,316,768 | 5/1967 | Cook | 33/362 |
| 3,564,401 | 2/1971 | Coon | 324/244 |
| 3,678,593 | 7/1972 | Baker et al. | 33/355 |
| 3,786,571 | 1/1974 | Kelman | 33/363 |
| 4,075,627 | 2/1978 | Pariza | 340/388 |
| 4,866,384 | 9/1989 | Oetzmann | 33/361 |
| 4,916,821 | 4/1990 | Potter | 33/362 |
| 5,199,178 | 4/1993 | Tong et al. | 33/361 |

OTHER PUBLICATIONS

Maddox, "Solid–State Physics Resurgent", *Nature*, vol. 328 Jul. 2, 1987. p. 11.
Arnold, "The Fluxgate, A Compass That Can Do Much More Than Point to North, Getting Cheaper, More Popular", *The Boston Globe*, Monday, Jun. 1, 1987, pp. 41, 43.
*The Boston Globe*, Sci–Tech, "Plotting A High–Tech Course", Jul., 1987, Classified p. 45.

*Primary Examiner*—William A. Cuchlinski, Jr.
*Assistant Examiner*—G. Bradley Bennett
*Attorney, Agent, or Firm*—Fish & Richardson

[57] ABSTRACT

An improved electronic magnetometer has a flux-concentrating core making grazing contact with a magnetically conductive element which is preferably part of a piezoelectric transducer. The core and transducer are mounted so as to make non-coherent, chattering contact when the transducer is caused to vibrate. A pickup coil attached to a signalling device enables a user to find a null in a field of magnetic flux with novel accuracy.

52 Claims, 1 Drawing Sheet

ELECTRONIC MAGNETOMETER AND COMPASS

This is a continuation of application Ser. No. 08/182,646, filed Jan. 14, 1992, now abandoned.

BACKGROUND OF THE INVENTION

The invention relates to electronic magnetometers and compasses.

An inexpensive, electronic magnetometer of simple construction is described in U.S. Pat. No. 4,916,821, which is incorporated by reference. The electronic magnetometer described in that patent includes a pair of flux-concentrating concentrating elements arranged in an overlapping fashion. The flux-concentrating elements are vibrated such that they rattle randomly or non-coherently against each other. By non-coherent, it is meant that energy is dispersed over numerous mechanical frequencies. This causes the magnetic field in the region of the juncture of the flux-concentrating elements to vary non-coherently as well. Consequently, current induced in a pickup coil surrounding the juncture varies in a non-coherent fashion. The induced current drives a speaker which, because the current varies non-coherently, produces a hiss. Oscillator leakage currents produce a slight whine audible through the hiss. Except at magnetic null, the amplitude of the hiss swamps the leakage whine. The ear's capacity to ignore the whine permits nulling to less than 10 seconds of arc.

The electronic magnetometer is swept through a horizontal arc to locate the east-west null in the Earth's magnetic field. When the flux-concentrating elements are aligned along the null, flux through them falls to zero. Accordingly, the non-coherent current induced in the pickup coil falls to zero and the hiss disappears, indicating east-west alignment.

It has been found through experience that the nulling sensitivity and accuracy of the magnetometer of U.S. Pat. No. 4,916,821 declines as the flux-concentrating elements are tilted away from level with the ground, since one element tip lies on top of the other element tip, and tilting the device above or below the horizon lightens the pressure of the upper element tip on the lower element tip. Furthermore, freedom of motion is required for the flux-concentrating elements to vibrate chaotically, and this freedom permits them to vibrate slightly in and out of alignment with each other. As a result, nulling accuracy is decreased.

The device can also be used as an electronic compass.

SUMMARY OF THE INVENTION

In a first aspect, the invention includes a magnetically conductive element, a flux-concentrating core with a longitudinal axis, and a driver which causes relative vibration of the element and the core in a direction generally aligned with the longitudinal axis of the core. The core and the element make non-coherent, chattering contact while vibrating.

In a second aspect, the invention includes a magnetically conductive element, a flux-concentrating core, and a driver which causes relative vibration of the element and the core. The core and the element make non-coherent, chattering contact, at a single point of contact, while vibrating.

In a third aspect, the invention includes a magnetically conductive element, a flux-concentrating core, and a driver which causes relative vibration of the element and the core. The core and the element make non-coherent, chattering contact, other than by effect of gravitational forces, while vibrating.

In a fourth aspect, the invention includes a magnetically conductive element with a surface, a flux-concentrating core perpendicular to the surface, and a driver which causes relative vibration of the element and the core. The core and the element make non-coherent, chattering contact while vibrating.

Embodiments include one or more of the following features. The magnetically conductive element is an iron layer of a piezoelectric transducer. The core, which is rod-shaped and has a pointed tip, is made from high magnetic permeability material such as High-μ 80™ or Permalloy™. The core and the magnetically conductive element make grazing contact when not vibrating, with the tip of the core touching an exposed surface of the magnetically conductive element. A pickup coil, perpendicular to the longitudinal axis of the core, is in the vicinity of the core to detect changing magnetic flux through the core.

The invention provides a magnetometer which is inexpensive, quite easy to assemble, and provides excellent flux detection capabilities. Rattling vibration of the core against the magnetically conductive element leads to a chaotic hiss which swamps the leakage whine. Distinct nulling as the core is aligned along a magnetic null, coupled with sensitivity of the ear to changes in amplitude of the hiss which allows the user to ignore the whine, allow the magnetometer to be used with relatively high precision for a device of its cost and complexity.

The flux-detecting capabilities have been found to be better than the flux-detecting capabilities of the electronic magnetometer of U.S. Pat. No. 4,916,821. Gravity is not required to cause rattling; hence, the device is not sensitive to core elevation angle. Additionally, mechanical play, which allows small misalignments of the flux-concentrating elements of U.S. Pat. No. 4,916,821, is eliminated between the flux-concentrating elements of the present invention by more restricted mechanical mounting. Thus, better performance is obtained with construction which is simpler and more inexpensive, as well.

Further embodiments and advantages will be apparent from the drawing, the description of a preferred embodiment, and from the claims.

BRIEF DESCRIPTION OF THE DRAWING

The single figure is a cross-sectional view of the electronic magnetometer of the invention, with cross hatched elements axisymmetric by revolution about axis A—A.

DESCRIPTION OF THE PREFERRED EMBODIMENT

Figure 1:
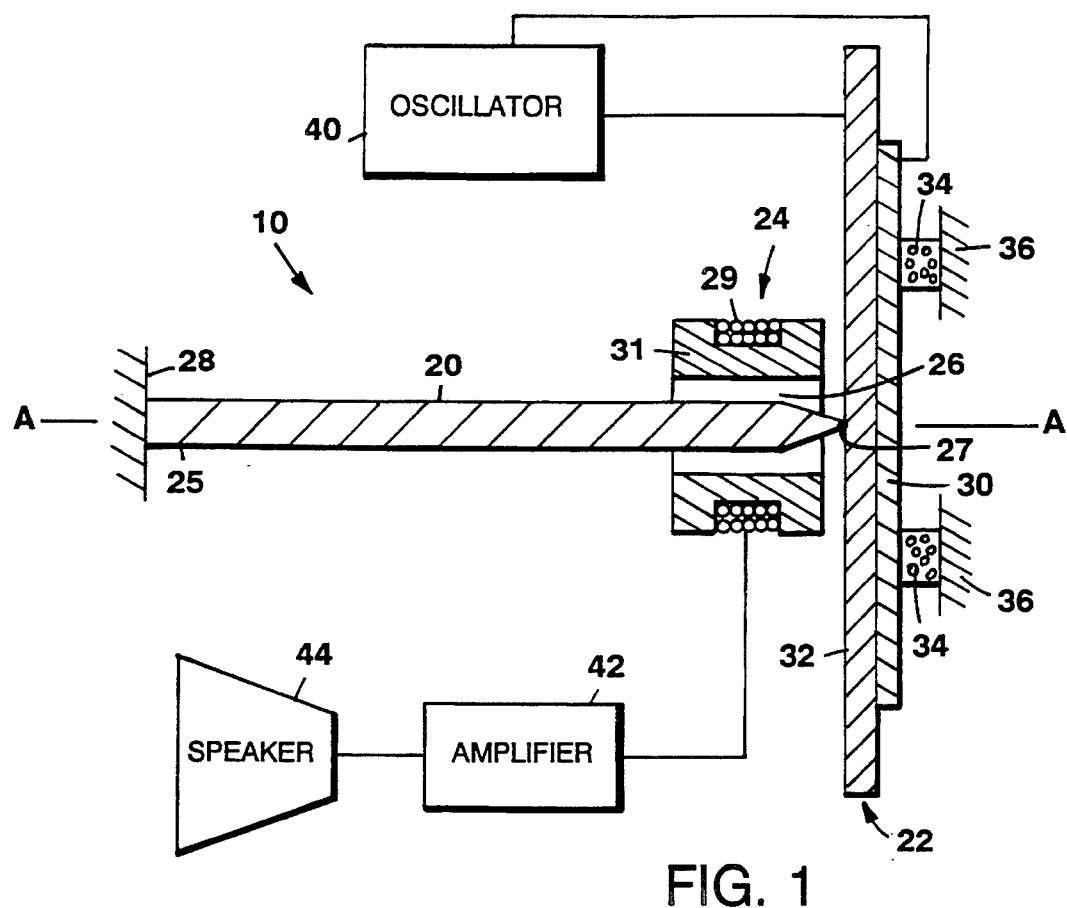

Electromagnetic magnetometer 10 consists, essentially, of a magnetic flux-concentrating core 20, a transducer assembly 22, and a pickup coil 24.

Flux-concentrating core 20 is a rod on the order of 1½ to 2 inches long and ⅛-inch in diameter. It is mounted securely at one end 25 to base or casing 28. The opposite end 26 terminates in a point 27. The flux-concentrating core should be made from a material of high magnetic permeability, such as High-μ80™ or Permalloy™.

Transducer assembly 22 is of an inexpensive type found in novelty items such as toy electric pianos and musical greeting cards. The assembly consists of a thin disc 30 of piezoelectric crystal bonded to a thin disc 32 of magnetically conductive metal, e.g., cheap iron. Both discs are on the order of 1 inch in diameter, although the piezoelectric disc 30 conventionally is smaller, as shown. The piezoelectric disc is on the order of 8 mils thick; the iron disc is on the order of 9 mils thick.

Transducer assembly 22 is mounted to three sponge rubber cubes 34, each ⅛-inch per side, which are attached to base or casing 36. (Only two are shown for clarity.) The sponge rubber cubes are evenly spaced 120° apart and are located at approximately ⅔ of the radius from the center of the piezoelectric disc. The sponge rubber cubes should be resilient enough that the transducer assembly is free to vibrate axially (i.e., in the direction of the core axis) against the tip of the flux-concentrating core, with the iron disk making non-coherent, chattering contact at, for the most part, a single point of contact.

The flux-concentrating core and transducer assembly are positioned perpendicularly to each other with the point of the flux-concentrating core making light, almost grazing contact with the center of the iron disk. In other words, the point just barely touches the surface of the iron disc, with very light pressure, such that vibratory motion of the transducer is not restricted.

An inexpensive electric oscillator 40 causes the piezoelectric transducer assembly to vibrate. The oscillator is a conventional circuit capable of oscillating over a frequency range containing the natural frequency of the piezoelectric crystal, e.g., from about two to four kilohertz, and producing an RMS amplitude of about five volts. One lead from the oscillator is connected to the iron disc; another lead is connected to a silverized surface 31 of the piezoelectric disc which is opposite the iron disc.

Pickup coil 24 surrounds the pointed end of the flux-concentrating core, near the point of contact between the core and the iron disc. The pickup coil is made from about one hundred to five hundred turns of #36 enameled copper wire 29, wrapped around a plastic bobbin 31. The pickup coil is connected to speaker 44 via amplifier 42. The speaker and amplifier are inexpensive elements such as can be found in portable, Walkman™-type tape players.

When the transducer assembly is caused to vibrate by the oscillator, the iron disc makes and breaks contact with the point of the flux-concentrating core in non-coherent, chattering fashion. When the core is oriented along a line of magnetic flux, flux through the pointed end of the core changes rapidly and non-coherently, inducing non-coherent, randomly varying current in the pickup coil which results in a hiss from the speaker as described above with respect to the embodiment shown in U.S. Pat. No. 4,916,821. A slight, constant whine, attributable to leakage current induced in the pickup coil by the oscillator, is also audible "behind" the hiss, but the hiss dominates the whine.

As with the earlier configuration, the east-west null in the Earth's magnetic field is located by sweeping the magnetometer through a horizontal arc with the flux-concentrating core held relatively parallel to the ground. The hiss varies in amplitude as the magnetic flux through the core varies with changing orientation of the core. Because the hiss varies, it is readily discernible over the whine, which stays constant. When the core is oriented along the east-west null, magnetic flux through the core goes to zero and the hiss disappears.

To distinguish east from west, the magnetometer is scanned to the right or left of the east-west null. As one turns towards magnetic north, the magnetic null inclines upward relative to the horizon; as one turns towards magnetic south, it inclines downward relative to the horizon. Thus, by swinging the magnetometer away from the east-west null and raising or lowering it to follow the null, it can be determined whether the original ground-parallel orientation was east or west. Thus, the magnetometer of the invention can be used as an electronic compass.

I have found that the embodiment described herein has more precise magnetic flux sensing capabilities than demonstrated by the embodiments in U.S. Pat. No. 4,916,821. This improved sensing capability is realized using an arrangement of readily available parts which is less complex and less expensive.

Other embodiments are within the scope of the following claims. For example, the transducer can have a disc of magnetically conductive material other than iron. Instead of a speaker, earphones can be used to signal the presence or absence of magnetic flux.

What is claimed is:

1. An electronic magnetometer comprising
   a magnetically conductive element,
   a flux-concentrating core having a longitudinal axis, and
   a driver for causing relative vibration of said element and said core in a direction essentially parallel with said longitudinal axis,
   said core and said element being arranged for non-coherent, chattering contact during said vibration.

2. The magnetometer of claim 1 wherein said core and said element are arranged to make grazing contact when not being caused to vibrate.

3. The magnetometer of claim 1 wherein said magnetically conductive element comprises an iron layer.

4. The magnetometer of claim 1 wherein said driver comprises a piezoelectric transducer.

5. The magnetometer of claim 4 wherein said magnetically conductive element comprises an iron layer.

6. The magnetometer of claim 1 wherein said core comprises high magnetic permeability material.

7. The magnetometer of claim 6 wherein said core comprises High-μ 80™ or Permalloy™.

8. The magnetometer of claim 1 wherein said core is rod-shaped.

9. The magnetometer of claim 1 wherein said core has a pointed tip.

10. The magnetometer of claim 9 wherein said magnetically conductive element is exposed to and touches said pointed tip.

11. The magnetometer of claim 1 further comprising a coil in the vicinity of said core to detect changing magnetic flux through said core.

12. The magnetometer of claim 11 wherein said coil is perpendicular to the longitudinal axis of said core.

13. The magnetometer of claim 1 wherein
   said core and said element make non-coherent, chattering contact at a single point of contact during said vibration.

14. The magnetometer of claim 13 wherein said core and said element are arranged to make grazing contact when not being caused to vibrate.

15. The magnetometer of claim 13 wherein said magnetically conductive element comprises an iron layer.

16. The magnetometer of claim 13 wherein said driver comprises a piezoelectric transducer.

17. The magnetometer of claim 16 wherein said magnetically conductive element comprises an iron layer.

18. The magnetometer of claim 13 wherein said core comprises high magnetic permeability material.

19. The magnetometer of claim 18 wherein said core comprises High-μ 80™ or Permalloy™.

20. The magnetometer of claim 13 wherein said core is rod-shaped.

21. The magnetometer of claim 15 wherein said core has a pointed tip.

22. The magnetometer of claim 21 wherein said magnetically conductive element is exposed to and touches said pointed tip.

23. The magnetometer of claim 13 further comprising a coil in the vicinity of said core to detect changing magnetic flux through said core.

24. The magnetometer of claim 13 further comprising a coil perpendicular to said axis to detect magnetic flux through said core.

25. The electronic magnetometer of claim 1 wherein said core and said element are arranged to make non-coherent, chattering contact, other than by effect of gravitational forces, during said vibration.

26. The magnetometer of claim 25 wherein said core and said element are arranged to make grazing contact when not being caused to vibrate.

27. The magnetometer of claim 25 wherein said magnetically conductive element comprises an iron layer.

28. The magnetometer of claim 25 wherein said driver comprises a piezoelectric transducer.

29. The magnetometer of claim 28 wherein said magnetically conductive element comprises an iron layer.

30. The magnetometer of claim 25 wherein said core comprises high magnetic permeability material.

31. The magnetometer of claim 30 wherein said core comprises High-µ 80™ or Permalloy™.

32. The magnetometer of claim 25 wherein said core is rod-shaped.

33. The magnetometer of claim 25 wherein said core has a pointed tip.

34. The magnetometer of claim 33 wherein said magnetically conductive element is exposed to and touches said pointed tip.

35. The magnetometer of claim 25 further comprising a coil in the vicinity of said core to detect changing magnetic flux through said core.

36. The magnetometer of claim 35 wherein said core has a longitudinal axis and said coil is perpendicular to said longitudinal axis.

37. An electronic magnetometer comprising a piezoelectric transducer comprising a piezoelectric crystal and a magnetically conductive element, a rod-shaped, pointed, flux-concentrating core, of high magnetic permeability material, having a longitudinal axis, and a coil in the vicinity of and perpendicular to said core to detect changing magnetic flux through said core, wherein said piezoelectric transducer and said core are arranged such that said magnetically conductive element and said core vibrate relative to each other, in a direction essentially parallel with said longitudinal axis, when an appropriate signal is applied to said piezoelectric crystal so as to make non-coherent, chattering contact, and said core and said element make grazing contact when not vibrating relative to each other.

38. An electronic magnetometer comprising a piezoelectric transducer comprising a piezoelectric crystal and a magnetically conductive element, a rod-shaped, pointed, flux-concentrating core of high magnetic permeability material, and a coil in the vicinity of and perpendicular to said core to detect changing magnetic flux through said core, wherein said piezoelectric transducer and said core are arranged such that said magnetically conductive element and said core vibrate relative to each other along a direction essentially parallel to the length of said rod-shaped core when an appropriate signal is applied to said piezoelectric crystal so as to make non-coherent, chattering contact at a single point of contact, and said core and said element make grazing contact when not vibrating relative to each other.

39. An electronic magnetometer comprising a piezoelectric transducer comprising a piezoelectric crystal and a magnetically conductive element, a rod-shaped, pointed, flux-concentrating core of high magnetic permeability material, and a coil in the vicinity of and perpendicular to said core to detect changing magnetic flux through said core, wherein said piezoelectric transducer and said core are arranged such that said magnetically conductive element and said core vibrate relative to each other in a direction essentially parallel to the length of said rod-shaped core, other than by effect of gravitational forces, when an appropriate signal is applied to said piezoelectric crystal so as to make non-coherent, chattering contact, and said core and said element make grazing contact when not vibrating relative to each other.

40. An electronic magnetometer comprising a magnetically conductive element having a surface, a flux-concentrating core having a longitudinal axis perpendicular to said surface, and a driver for causing relative vibration of said element and said core in a direction essentially parallel to said longitudinal axis, said core and said element being arranged to make non-coherent, chattering contact during said vibration.

41. The magnetometer of claim 40 wherein said core and said element are arranged to make grazing contact when not being caused to vibrate.

42. The magnetometer of claim 41 wherein said core has a pointed tip.

43. The magnetometer of claim 42 wherein said magnetically conductive element is exposed to and touches said pointed tip.

44. The magnetometer of claim 40 wherein said magnetically conductive element comprises an iron layer.

45. The magnetometer of claim 40 wherein said driver comprises a piezoelectric transducer.

46. The magnetometer of claim 45 wherein said magnetically conductive element comprises an iron layer.

47. The magnetometer of claim 40 wherein said core comprises high magnetic permeability material.

48. The magnetometer of claim 47 wherein said core comprises High-µ 80™ or Permalloy™.

49. The magnetometer of claim 40 wherein said core is rod-shaped.

50. The magnetometer of claim 40 further comprising a coil in the vicinity of said core to detect changing magnetic flux through said core.

51. The magnetometer of claim 50 wherein said core has a longitudinal axis and said coil is perpendicular to said longitudinal axis.

52. An electronic magnetometer comprising a piezoelectric transducer comprising a piezoelectric crystal and a magnetically conductive element having a surface, a rod-shaped, pointed, flux-concentrating core, of high magnetic permeability material, having a longitudinal axis perpendicular to said surface, and a coil in the vicinity of and perpendicular to said core to detect changing magnetic flux through said core, wherein said piezoelectric transducer and said core are arranged such that said magnetically conductive element and said core vibrate relative to each other in a direction essentially parallel to the longitudinal axis when an appropriate signal is applied to said piezoelectric crystal so as to make non-coherent, chattering contact, and said core and said element make grazing contact when not vibrating relative to each other.

* * * * *

UNITED STATES PATENT AND TRADEMARK OFFICE
CERTIFICATE OF CORRECTION

PATENT NO. : 5,488,778

DATED : February 6, 1996

INVENTOR(S) : Bronson Potter

It is certified that error appears in the above-indentified patent and that said Letters Patent is hereby corrected as shown below:

In col. 1, line 5, delete "1992" and insert --1994--.

In col. 1, line 15, delete the second occurrence of "concentrating".

Signed and Sealed this

Twenty-fourth Day of December, 1996

Attest:

BRUCE LEHMAN

*Attesting Officer*  *Commissioner of Patents and Trademarks*